United States Patent [19]

Suzuki et al.

[11] Patent Number: 5,043,297
[45] Date of Patent: Aug. 27, 1991

[54] WIRING METHOD OF ON-CHIP MODIFICATION FOR AN LSI

[75] Inventors: Katsuyoshi Suzuki, Hadano; Masato Hamamoto, Ome; Takahiko Takahashi, Iruma, all of Japan

[73] Assignee: Hitachi, Ltd., Tokyo, Japan

[21] Appl. No.: 571,179

[22] Filed: Aug. 22, 1990

[30] Foreign Application Priority Data

Sep. 5, 1989 [JP] Japan .................. 01-228255

[51] Int. Cl.⁵ .......................................... H01L 21/268
[52] U.S. Cl. ...................................... 437/51; 437/173; 437/195; 437/935
[58] Field of Search ............... 437/195, 923, 51, 173, 437/922, 935; 148/DIG. 26; 364/488, 489, 490, 491

[56] References Cited

U.S. PATENT DOCUMENTS

| 4,240,094 | 12/1980 | Mader | 437/935 |
|---|---|---|---|
| 4,259,367 | 3/1981 | Dougherty et al. | 437/923 |
| 4,795,720 | 1/1989 | Kawanabe et al. | 437/922 |
| 4,868,068 | 9/1989 | Yamaguchi et al. | 437/195 |
| 4,900,695 | 2/1990 | Takahashi et al. | 437/195 |

FOREIGN PATENT DOCUMENTS 62-229956 10/1987 Japan .
62-298134 12/1987 Japan .
2-15657 1/1990 Japan .

Primary Examiner—Brian E. Hearn
Assistant Examiner—Chandra Chaudhari
Attorney, Agent, or Firm—Kenyon & Kenyon

[57] ABSTRACT

A wiring method for on-chip modification of an LSI is provided to cut a portion of a wire inside of the LSI with an ion beam and connect the wire with a laser induced CVD process so that the logic is changed when developing the LSI. The method comprises the steps of cutting or connecting an LSI wire even if another wire is located above or adjacent to the LSI wire and repairing an excessively cut or connected portion. The method thus makes it possible to widen the range of a possible cutting or connection spot, thereby making any kind of repairs possible, some of which would have never been repaired by the conventional method.

12 Claims, 5 Drawing Sheets

WIRING METHOD OF ON-CHIP MODIFICATION FOR AN LSI

BACKGROUND OF THE INVENTION

The present invention relates to a wiring method involving on-chip modification for an LSI and more particularly to a method for changing the logic of a semiconductor integrated circuit chip by cutting or connecting a wire pattern provided on the chip after manufacturing the chip and to a method which can offer more freedom of modifying portions and changing logic.

Today, as a semiconductor integrated circuit becomes more integrated and minute, more complicated and massive logical information is required which indicates logical connection consisting of circuit element groups composing an LSI and signal lines connecting these circuit element groups.

Even if some logical failure occurs in an LSI, therefore, it has been difficult to find all of the logical failures in the design stage. Furthermore, in the manufacturing stage, some failure may occur. This kind of logical failure cannot be found until the LSI is mounted to a device and is checked. In such a case, re-manufacturing of the LSI is preferable, but it requires such a long period of delay in the development of a device having the LSI mounted thereon, which delay is not preferable.

In order to cope with a case wherein some logical failure is found on a LSI mounted on a device, various kinds of techniques have been studied and proposed for working wiring, repairing defective portions and changing the LSI logic for a short time by cutting or connecting one or more wires provided on the LSI chip.

According to a first prior art technique, as disclosed in JP-A-62-229956, a method is provided for connecting or cutting the wiring of an LSI by an energy beam such as a ion beam or an laser induced CVD process.

According to a second prior art technique, as disclosed in JP-A-62-298134, preliminary wiring is provided within the LSI for facilitating connections in the LSI wiring.

According to a third prior art technique, as disclosed in JP-A-2-15657, an interval between two wires in the LSI wiring is kept so that the interval is used for connecting or cutting the wire.

For defining a spot on which a wire is to be cut and/or connected, the foregoing prior art disadvantageously has to consider the state of a wire above or adjacent to the spot interest. If the adjacent condition is not met, therefore, it is impossible to connect or cut the wire provided in the LSI, thereby inhibiting the ability to change the LSI logic by repairing.

Further, the foregoing prior art disadvantageously has to extend a wire pattern interval or pull out the wire pattern to the top wiring layer for the purpose of facilitating connecting or cutting on the initial design of an LSI to be repaired.

SUMMARY OF THE INVENTION

In order to overcome the foregoing disadvantages, the present invention provides a wiring method for repairing an LSI which is capable of cutting, connecting and working a wire at any spot for repairing an LSI without having to consider the wire above or adjacent to the wire to be cut as well as designing an LSI without having to consider the repair of the LSI at an initial design stage.

The present invention, achieves this by cutting a wire without having to consider a wire pattern above or adjacent to the wire to be cut. If the above or adjacent wire is erroneously cut, the method electrically connects the erroneously cut portion with some connecting technique such as a laser induced CVD process (referred to as a laser CVD process).

And, the present invention can also be realized by punching a chip at a desired wire spot for implementing a wiring without having to consider the wire pattern above or adjacent to the wire to be cut and pulling the wire out of the punched hole, if the above or adjacent wire is erroneously cut or is contacted with another wire, and cutting both sides of the wire pattern and electrically connecting both sides with some connecting technique.

The present invention makes it possible to cut a wire at a desired spot and connect the wire at a desired spot without having to consider the wire pattern above or adjacent to the wire to be treated.

DETAILED DESCRIPTION

Hereinafter, a wiring method of on-chip modification for an LSI realized according to an embodiment of the present invention will be described with reference to the drawings.

FIGS. 1A to 1E are sectional views of a wiring layer illustrating how a wire is cut inside of an LSI chip. As shown, 1 denotes an insulating material, 2 denotes a second metal wire pattern, 3 denotes a first metal wire pattern, and 4 denotes a micro ion beam.

Figure 1A:
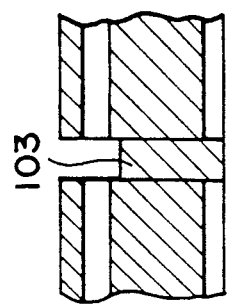
FIGS. 1A to 1E are sectional views illustrating how a wire is cut inside of an LSI chip.
Figure 1B:
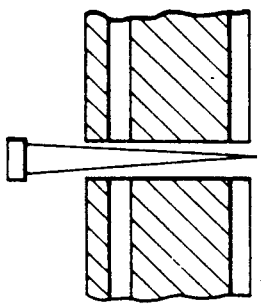
Figure 1C:
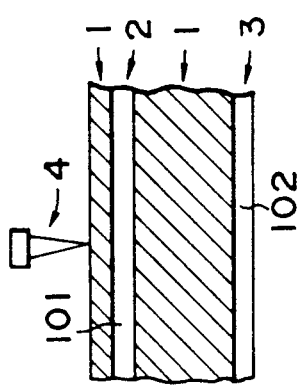
Figure 1D:
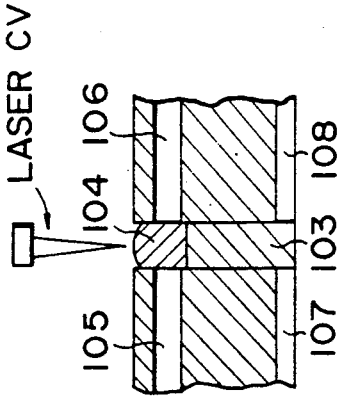

Assume that the portion to be cut is a spot 102 located on the wire pattern shown in FIG. 1A. For cutting the spot 102 of the wire pattern, a micro ion beam 4 is radiated to another wire pattern. Since, however, another wire pattern exists above the spot 102 of the wire pattern, the spot 102 cannot be cut, alone thereby being unable to avoid the disconnecting of a spot 101 located on the wire pattern existing above the wire pattern having the spot 102 as shown in FIG. 1B. Next, as shown in FIG. 1C, an insulating material 103 is formed in the bottom of a hole opened by the micro ion beam 4 for insulating the spot 102 located on the wire pattern. Then, as shown in FIG. 1D, a metal film 104 is formed in the excessively cut-out spot 101 by a laser CVD process. The metal film 104 serves to connect wire patterns 105 and 106 located on both ends of the excessively formed spot 101. The end result is a separation of the wire at the spot 102 located on the wire pattern, which means that an initial object can be achieved.

Figure 1E:
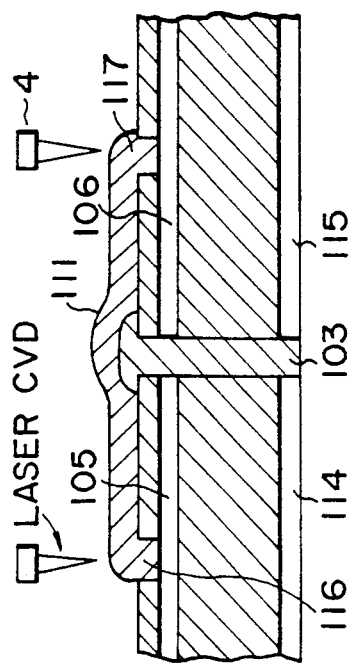

In a variation of this invention, it is possible that in the process of forming the insulating material 103 shown in FIG. 1B, since the insulating material 103 is finely formed, the insulating material 103 is extended into the spot 101, and further extend to separate the wire patterns 105 and 106 located on both ends of the spot 101 as shown in FIG. 1E. When this type of disconnection occurs, a micro ion beam 4 is radiated in a manner to open the upper insulating layer 1 located on the wire patterns 105 and 106 to form holes 116 and 117. Then, a metal film 111 is formed by the laser CVD process for connecting the holes 116 and 117. That is, the metal film 111 serves as connecting the wire patterns 105 and 106 located on both ends of the excessively cut-out spot 101. It results in cutting only the spot 102 located on the wire pattern, which means the initial object can be achieved.

Figure 2:
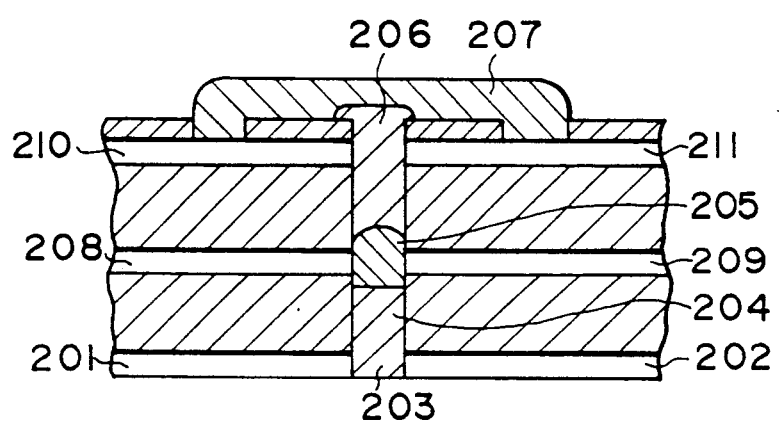
FIGS. 2 and 3 are sectional views illustrating a cutting result in a case where a plurality of wiring layers are located above a wire pattern to be cut.
Figure 3:
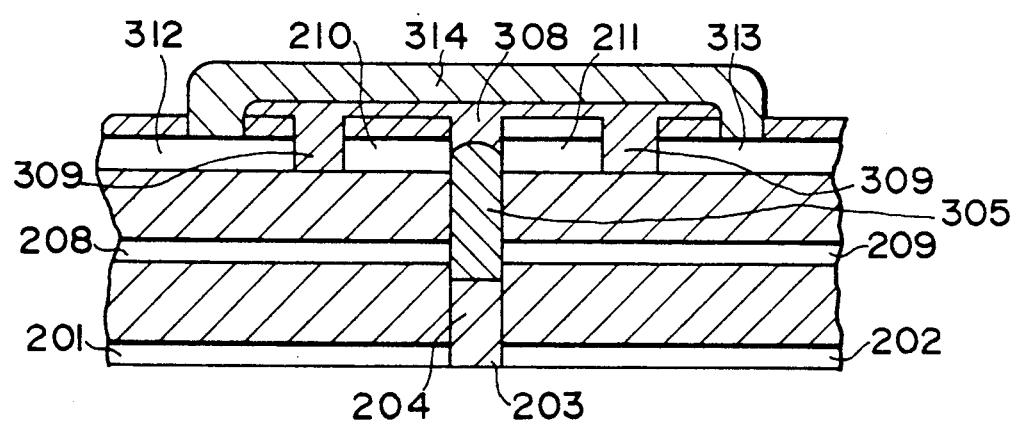

FIGS. 2 and 3 are sectional views illustrating a cutting result in a case where a plurality of wiring layers exist above the spot to be cut.

In FIG. 2, assume that the portion to be cut is a spot 203 of the lowest wiring layer. Like the description with respect to FIGS. 1A to 1E, a micro ion beam is radiated for forming a hole extending from the top to the spot 203, thereby cutting the spot 203. This also results in dividing the upper wire patterns into the wire patterns 208, 209 and 210, 211.

At first, an insulating material 204 is formed in the lowest portion of the hole. After the cutting spot 203 is separated into the wire patterns 201 and 202, a metal film 205 is formed by the laser CVD process in a manner to connect the upper wire patterns 208 and 209 located above the spot 203. Then, an insulating material 206 is formed on the metal film 205, resulting in leaving the top wire pattern 210 insulated from the top wire patern 211. Like the description with respect to FIG. 1E, a micro ion beam is radiated for opening a hole on the top insulating material located on each of the wire patterns 210 and 211. A metal film 207 is formed by the laser CVD process for connecting the holes.

The metal film 205 serves as connecting the wire patterns 208 and 209 located on both ends of the excessively cut-out spot and the metal film 207 serves as connecting the wire patterns 210 and 211. The end result is that there is a wire separation only at the spot 203 located on the wire pattern, which means that the initial object can be realized.

In a case wherein the fine working done by the laser CVD process results in forming the metal film 205, the erroneously-adjusted working precision may allow the metal film 205 to extend like a metal film 305 as shown in FIG. 3, thereby connecting all the wire patterns 208 to 211.

In such a case, the micro ion beam is radiated for forming a hole 309 on the wire patterns 210 and 211. Then, an insulating material 308 is formed in the holes 309 for separating the top into different portions. Next, the insulating material is removed on the wire patterns 312 and 313 outside of the holes 309 so that the metal film 314 serves as connecting both of the wire patterns 312 and 313. This again results in separating only the wire pattern at spot 203, which means the initial object is realized.

As will be apparent from the above description, in a case wherein a plurality of wiring layers exist above the spot of the wire pattern to be cut, the foregoing embodiment of the invention makes it possible to cut the lowest wire pattern at any location by the combination of the processes shown in FIGS. 1D and 1E.

Figure 4A:
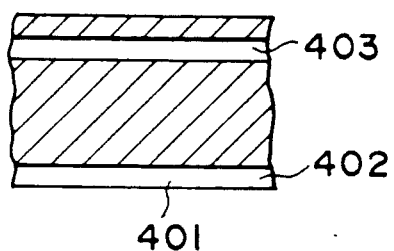
FIGS. 4A to 4C are sectional views illustrating how wire patterns are connected.
Figure 4B:
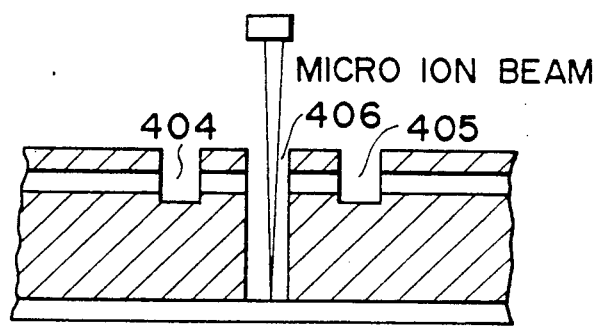
Figure 4C:
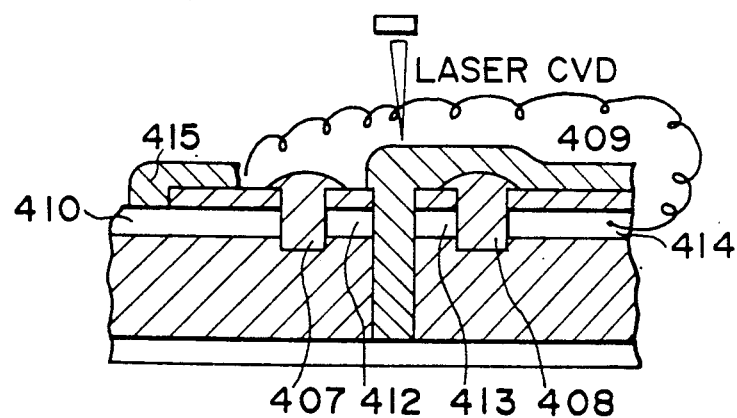

FIGS. 4A to 4C are sectional views illustrating how the wire patterns are connecting in a stepwise manner.

As shown in FIG. 4A, assume that a wire pattern is pulled out of the spot 401 located on the lowest wire pattern 401. At first, as shown in FIG. 4B, the micro ion beam is radiated above the spot 401 for opening a hole. It results in often cutting a wire pattern 403 located above the wire pattern 402 at the location of a spot 406, above spot 401, that is, it forms an excessively cut-out portion. In such a case, it is necessary to cut the wire pattern 403 at spots 404 and 405 which are located on both ends of the spot 406 to be cut.

Then, as shown in FIG. 4C, insulating materials 407, 408 are formed in the cut-out spots 404 and 405 so that the wire pattern 403 can be insulated and separated into the wire patterns 410, 412, 413 and 414. A metal film 409 is formed by the laser CVD process in a manner to pull or connect to a wire pattern 401. Then, with the method described with respect to Fig. 1E, a metal film 415 is formed between the wire patterns 410 and 414, which are left cut, by the laser CVD process so that the metal film 415 serves as connecting both of the patterns 410 and 414.

The foregoing embodiment of the present invention makes it possible to pull the wire pattern out of the lowest wiring layer and connect the wire pattern with another wire pattern, thereby allowing changes to the logic located on the LSI chip.

Figure 5A:
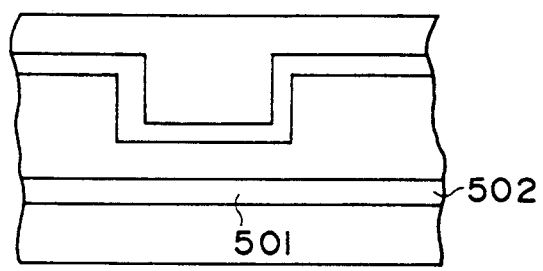
FIGS. 5A and 5B are plane views illustrating how a wire pattern is cut in a case where a narrow interval is kept between the adjacent wire patterns.
Figure 5B:
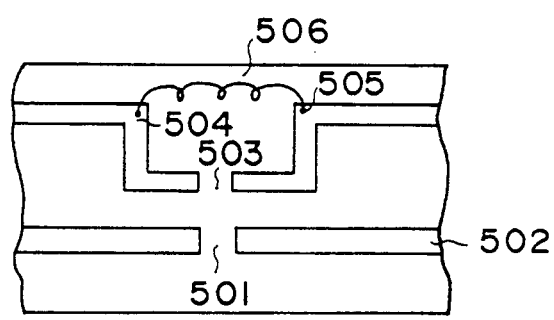

FIGS. 5A and 5B are plane views illustrating a method for cutting a wire pattern in a case wherein a narrow interval is kept between the adjacent wire patterns.

As shown in FIG. 5A, assume that a portion to be cut is a spot 501 located on a wire pattern 502. By cutting the wire pattern 502 at the spot 501 with the foregoing method, as shown in FIG. 5B, the upper wire pattern is cut at the spot 503. In such a case, with the foregoing connecting and cutting technique, a metal film 506 is connected between spots 504 and 505 located on the wire pattern spaced from the adjacent wire pattern 502, resulting in achieving the disconnection of the wire pattern at the spot 501.

The foregoing embodiment has been described on the assumption that the wire patterns are adjacent to each other on the same plane. The present invention, however, may apply to not only the structure wherein the cut point is located at the same level as the wire pattern but also another structure wherein multi-layered wire patterns, that is, all the wire patterns collected to a hole are provided.

Figure 6A:
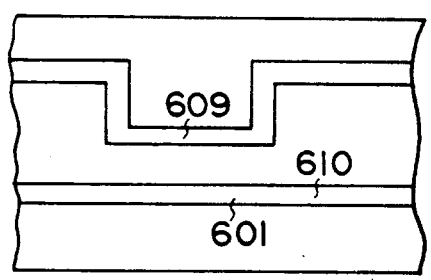
FIGS. 6A and 6B are plane views illustrating how a wire pattern is connected in a case where a narrow interval is kept between the adjacent wire patterns.
Figure 6B:
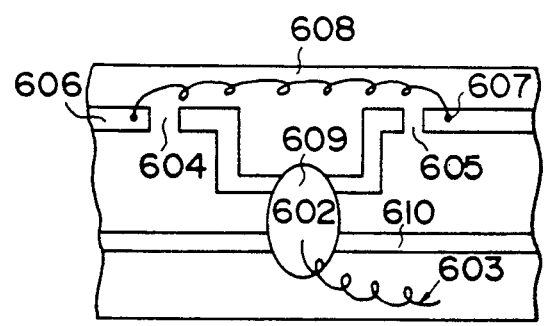

FIGS. 6A and 6B are plane views illustrating how a wire pattern is connected in a case where a narrow interval is kept between adjacent wire patterns.

As shown in FIG. 6A, assume that a wire 603 (FIG. 6B) is to be pulled out of a spot 601 located on the wire pattern 610.

In this case, as shown in FIG. 6B, for pulling the wire 603, with the foregoing method, a hole is opened on the spot 601 and then a metal film 602 is formed in the hole by the laser CVD process. Since, however, the distance between the wire patterns 609 and 610 is short, the metal film 602 also serves to connect the wire patterns 609 and 610. Thus, the wire pattern 609 is cut at spots 604 and 605 which keep a wide interval with the adjacent pattern. Then, with the foregoing connecting technique, a wire pattern 608 is formed between the cut wire patterns 606 and 607 for connecting them. Next, a wire pattern 603 is formed.

The foregoing embodiment of the invention makes it possible to pull the wire pattern at any spot located on the wire pattern, thereby changing the logic on the LSI.

The foregoing embodiments of the invention can be manually implemented. The present invention may also be designed to automatically implement all of these embodiments.

Figure 7:
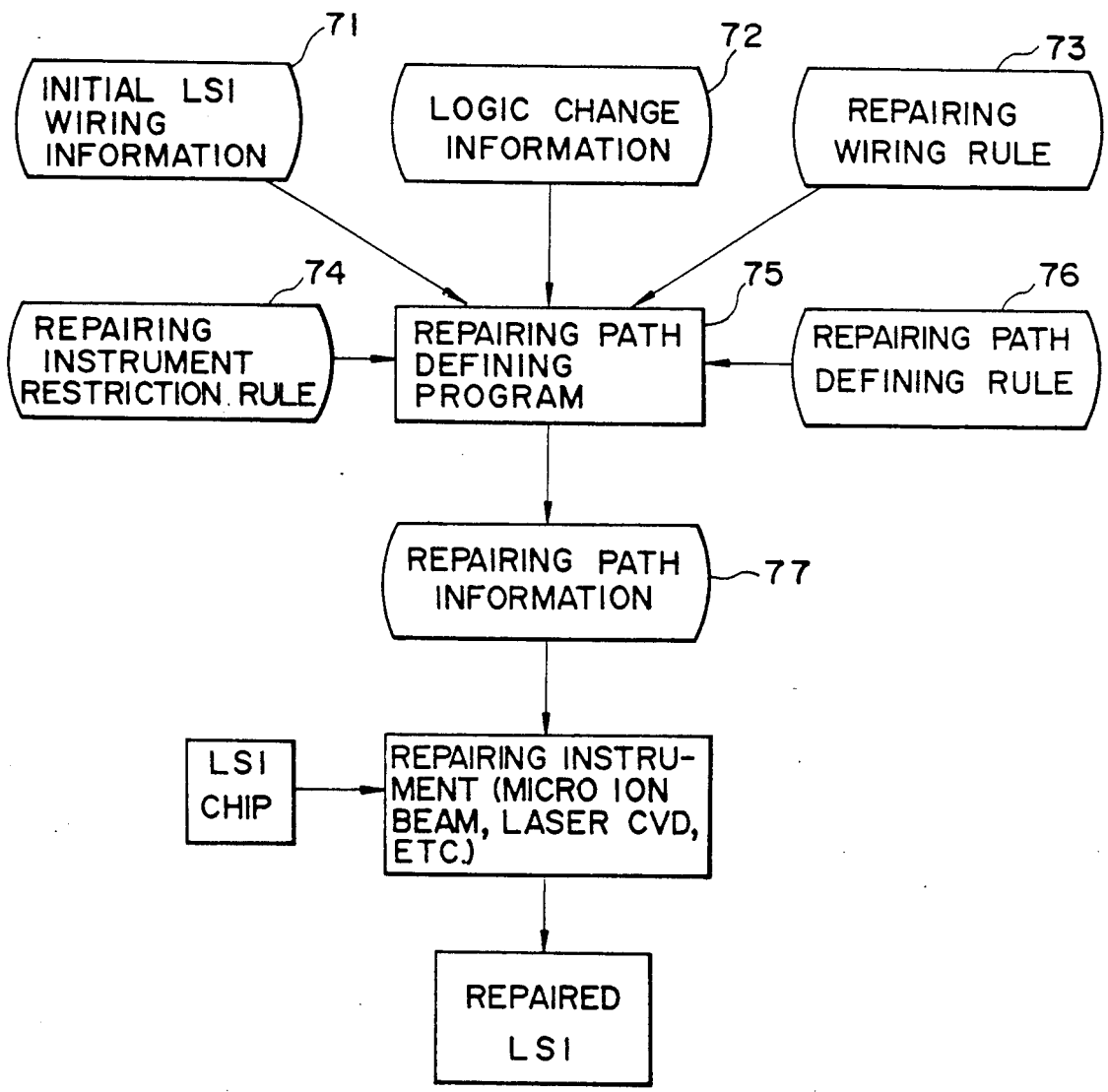
FIG. 7 is a flowchart illustrating the operation of a system for defining a wiring path to be repaired, which serves to automatically implement the method of the present invention.

FIG. 7 is a flowchart illustrating an operation of a system for defining a wire path to be repaired, which system serves to automatically implement the foregoing embodiments. The description will be directed to the operation of the system.

The embodiment of the invention shown in FIG. 7 comprises an initial LSI wiring information 71 that retains initial LSI wire pattern information in a three-dimensional direction, that is, the X-Y direction and the layer direction, a repairing instrument restriction rule 74 concerned with working rules such as working precision (for example, the disconnection of the adjacent wire of a Y-Y directed lattice) assumed if a chip is worked by some techniques such as a micro ion beam or a laser CVD process, a repairing wiring rule 73 concerned with the methods described with respect to the foregoing embodiments of the invention, a repairing path defining rule 76, and logic changing information 72. The embodiment serves to merge these informations and rules with the information about which wire to be cut or connected and generate the repairing path information 77 in accordance with a repairing path defining program 75.

For defining a cut-out or connection spot located on a wire pattern in accordance with the repairing path defining program, it is preferable to select a spot on which it is unnecessary to work on the wire pattern above or adjacent to the wire pattern to be repaired. If this is impossible, it is preferable to generate a wire path with the foregoing embodiment of the invention.

The repairing instrument such as a micro ion beam or a laser CVD process employs the repairing path information 77 generated as mentioned above for repairing the LSI chip wiring, thereby obtaining the repaired LSI chip having a changed logic.

The foregoing embodiment of the present invention makes it possible to repair the cut-out or connection spot again even if the cut-out or connection may occur on the above or adjacent wire and to cut or connect the wire pattern at any spot, thereby offering more freedom to change the LSI chip logic. Further, the path of a wire to be repaired can be automatically defined on the basis of a program, resulting in reducing the number of persons relevant to the operation to a minimum and improving repairing efficiency of a wiring and the reliability of the repaired LSI chip.

As described above, in order to define connection and cutting spots, if the logic of the LSI chip is changed by partially cutting or connecting a wire, the present invention does not have to consider any wire pattern located above or adjacent to these spots. As such, it is possible to avoid having to give up a change of LSI chip logic. That is, the present invention can greatly enhance freedom to repair LSI circuitry.

Further, the present invention can reduce the steps required for the initial design, because it is unnecessary to implement some operations preparing for the change of the LSI logic at the initial design of an LSI, such as forming a wide interval between wire patterns or pulling a portion of a wire pattern to the top wiring layer.

And, the present invention makes it possible to automatically design an LSI based on a program, resulting in improving reliability of a repaired LSI and a yield of LSIs.

What is claimed is:

1. A wiring method for on-chip modification of, an LSI, comprising the steps of;
   radiating an energy beam from a spot located above a manufactured LSI chip used for a semiconductor integrated circuit to the upper surface said chip used for a semiconductor integrated circuit, and
   cutting or connecting one or more portions of a first wire pattern for changing the logic of said semiconductor integrated circuit,
   whereby the method of cutting and connecting the first wire pattern comprises the steps of cutting the first wire pattern and a second wire pattern located above said first wire pattern, inserting an insulator into a hole formed by the process of cutting said first and second wire patterns to electrically isolate a first portion and a second portion of said first wire pattern, forming a metal film in said hole above said insulator to electrically connect both a first portion and a second portion of said second wire pattern.

2. The wiring method for on-chip modification of an LSI of claim 1, further comprising the step of forming a metal film between a first area of a first portion of a third wire pattern and a first area of a second portion of said third wire pattern thereby electrically connecting said first and second portions of said third wire pattern.

3. A wiring method for, on-chip modification of an LSI comprising the steps of;
   radiating an energy beam from a spot located above a manufactured LSI chip used for a semiconductor integrated circuit to the upper surface of the chip, and
   cutting or connecting one or more portions of a first wire pattern for changing the logic of said semiconductor integrated circuit,
   whereby a plurality of wire patterns are provided above said first wire pattern and the method of cutting and connecting the first wire pattern comprises the steps of, cutting the plurality of wire patterns located above said first wire pattern at the time of cutting, said first wire pattern thereby separating each of said plurality of wire patterns into first and second portions, inserting an insulator into a hole formed by cutting said plurality of wire patterns, forming a metal film in said hole above said insulator between the first and second portions of at least one of said plurality of wire patterns.

4. A wiring method for on-chip modification of an LSI comprising the steps of;
   radiating an energy beam from a spot located above a manufactured LSI chip used for a semiconductor integrated circuit to the upper surface of the chip, and
   cutting or connecting one or more portions of a first wire pattern for changing the logic of said semiconductor integrated circuit,
   whereby the method of cutting and connecting the first wire pattern comprises the steps of punching a hole in the chip at a desired connection spot, forming a metal film in the hole punched in said chip, the metal film forming an extension of the first wire pattern, wherein a second wire pattern is disposed above said connection spot, cutting said second wire pattern when punching the chip thereby separating said second wire pattern into first and second portions, and forming a metal film between said first and second portions of said second wire pattern to electrically connect said first and second portions.

5. A wire method for on-chip modification of an LSI comprising the steps of;

radiating an energy beam from a spot located above a manufactured LSI chip used for a semiconductor integrated circuit to the upper surface of said chip, and cutting or connecting one or more portions of a first wire pattern for changing the logic said semiconductor integrated circuit, whereby the method of cutting and connecting the first wire pattern comprises the steps of cutting a second wire pattern adjacent to the first wire pattern at the time of cutting said first wire pattern thereby forming first and second wire pattern of said second wire pattern, and forming a metal film between first and second portions of said second wire pattern to electrically connect said first and second portions.

6. A wiring method for on-chip modification of an LSI comprising the steps of;

radiating an energy beam from a spot located above a manufactured LSI chip used for a semiconductor integrated circuit to the upper surface of said chip, and cutting or connecting one or more portions of a first wire pattern for changing the logic of said semiconductor integrated circuit, whereby the method of cutting and connecting the first wire pattern comprises the steps of punching a hole in the chip at a desired connection spot, cutting an adjacent second wire pattern into first and second portions while punching the chip, forming a first metal film in said punched hole, wherein said first metal film electrically connects said first and second wire patterns said first portion is separated into first and second subportions and said second portion is separated into third and fourth subportions, a second metal film is formed between said first and fourth subportions wherein said second and third subportions are electrically connected by said first metal film.

7. A wiring method for on-chip modification of an LSI comprising the steps of;

radiating an energy beam from a spot located above manufactured LSI chip used for a semiconductor integrated circuit to the upper surface of said chip, and cutting or connecting one or more portions of a first wire pattern for changing the logic of said semiconductor integrated circuit, and merging wiring information and logic change information for defining a cutting spot, a connection spot and a connection path of an LSI to be repaired, a constriction rule given by a working machine, and a to-be-repaired wiring rule whereby the method of cutting and connecting the first wire pattern comprises the steps of cutting the first wire pattern and a second wire pattern located above said first wire pattern, inserting an insulator into a hole formed by the process of cutting said first and second wire patterns to electrically isolate a first portion and a second portion of said first wire pattern, forming a metal film in said hole above said insulator to electrically connect both a first portion portion a first and a second portion of said second wire pattern, in a manner to define an operation path minimizing necessary repair work in accordance with a software program.

8. The method of claim 7 wherein said to-be-repaired wiring rule further comprises the step of forming a metal film between a first area of a first portion of a third wire pattern and a first area of a second portion of said third wire pattern thereby electrically connecting said first and second portions of said third wire pattern.

9. A wiring method for on-chip modification of an LSI comprising the steps of;

radiating an energy beam from a spot located above a manufactured LSI chip used for a semiconductor integrated circuit to the upper surface of said chip, and cutting or connecting one or more portions of a first wire pattern for changing the logic of said semiconductor integrated circuit, and merging wiring information and logic change information for defining a cutting spot, a connection spot and a connection path of an LSI to be repaired, a construction rule given by a working machine, and a to-be-repaired wiring rule whereby a plurality of wire patterns are provided above said first wire pattern and the method of cutting and connecting the first wire pattern comprises the steps of, cutting the plurality of wire patterns located above said first wire pattern at the time of cutting, said first wire pattern thereby separating each of said plurality of wire patterns into first and second portions, inserting an insulator into a hole formed by cutting said plurality of wire patterns, forming a metal film in said hole above said insulator between the first and second portions of at least one of said plurality of wire patterns in a manner to define an operation path minimizing necessary repair work in accordance with a software program.

10. A wiring method for on-chip modification of an LSI comprising the steps of;

radiating an energy beam from a spot located above a manufactured LSI chip used for a semiconductor integrated circuit to the upper surface of said chip, and cutting or connecting one or more portions of a first wire pattern for changing the logic of said semiconductor integrated circuit, and merging wiring information and logic change information for defining a cutting spot, a connection spot and a connection path of an LSI to be repaired, a construction rule given by a working machine, and a to-be-repaired wiring rule whereby the method of cutting and connecting the first wire pattern comprises the steps of punching a hole in the chip at a desired connection spot, forming a metal film in the hole punched in said chip, the metal film forming an extension of the first wire pattern, wherein a second wire pattern is disposed above said connection spot, cutting said second wire pattern when punching the chip thereby separating said second wire pattern into first and second portions, and forming a metal film between second portions of said second wire pattern to electrically connect said first and second portions in a manner to define an operation path minimizing necessary repair work in accordance with a software program.

11. A wiring method for on-chip modification of an LSI comprising the steps of;

radiating an energy beam from a spot located above a manufactured LSI chip used for a semiconductor integrated circuit to the upper surface of said chip, and cutting or connecting one or more portions of a first wire pattern for changing the logic of said semiconductor integrated circuit, and merging wiring information and logic change information for defining a cutting spot, a connection spot and a connection path of an LSI to be repaired, a construction rule given by a working machine, and a to-be-repaired wiring rule whereby the method of cutting and connecting the first wire pattern comprises the steps of cutting a second wire pattern adjacent to the first wire pattern at the time of cutting said first wire pattern thereby forming first and second wire pattern of said second wire pattern, and forming a metal film between first and second portions of said second portions to electrically connect said first and second portions in a manner to define an operation path minimizing necessary repair work in accordance with a software program.

12. A wiring method for on-chip modification of an LSI comprising the steps of;

radiating an energy beam from a spot located above a manufactured LSI chip used for a semiconductor integrated circuit to the upper surface of said chip, and cutting or connecting one or more portions of a first wire pattern for changing the logic of said semiconductor integrated circuit, and merging wiring information and logic change information for defining a cutting spot, a connection spot and a connection path of an LSI to be repaired, a construction rule given by a working machine, and a to-be-repaired wiring rule whereby the method of cutting and connecting the first wire pattern comprises the steps of punching a hole in the chip at a desired connection spot, cutting an adjacent second wire pattern into first and second portions while punching the chip, forming a first metal film in said punched hole, wherein said first metal film electrically connects said first and second wire patterns said first portion is separated into first and second subportions and said second portion is separated into third and fourth subportions, a second metal film is formed between said first and fourth subportions wherein said second and third subportions are electrically connected by said first metal film in a manner to define an operation path minimizing necessary repair work in accordance with a software program.

* * * * *

UNITED STATES PATENT AND TRADEMARK OFFICE
CERTIFICATE OF CORRECTION

PATENT NO.  : 5,043,297

DATED       : 27 August 1991

INVENTOR(S) : Katsuyoshi SUZUKI et al.

It is certified that error appears in the above-identified patent and that said Letters Patent is hereby corrected as shown below:

| Column | Line | |
|--------|------|---|
| 1 | 17 | Change "connection" to --connections--. |
| 1 | 40 | Before "ion" change "a" to --an--.; before "laser" change "an" to --a--. |
| 1 | 52 | After "spot" insert --of--. |
| 2 | 58 | After "cut" delete ","; after "alone" insert --,--. |
| 3 | 8 | Change "extend" to --extends--. |
| 3 | 43 | Change "as" to --for--. |
| 3 | 45 | Change "as" to --for--. |
| 3 | 59 | After "top" insert --wire pattern--. |
| 4 | 5 | Change "connecting" to --connected--. |

UNITED STATES PATENT AND TRADEMARK OFFICE
CERTIFICATE OF CORRECTION

PATENT NO. : 5,043,297  
DATED : 27 August 1991  
INVENTOR(S) : Katsuyoshi SUZUKI et al.

Page 2 of 2

It is certified that error appears in the above-identified patent and that said Letters Patent is hereby corrected as shown below:

| Column | Line | |
|---|---|---|
| 4 | 11 | Before "location" change "the" to --a--; before "spot" change "a" to --the--. |
| 4 | 25 | Change "as" to --for--. |
| 4 | 50 | Before "wire" change "the" to --another--. |
| 4 | 51 | Before "structure" change "another" to --the--. |
| 7 | 16 | After "logic" insert --of--. |
| 7 | 22 | Change "pattern" to --patterns--. |
| 8 | 5 | Delete "portion a first". |

Signed and Sealed this

Twenty-third Day of February, 1993

Attest:

STEPHEN G. KUNIN

Attesting Officer      Acting Commissioner of Patents and Trademarks